United States Patent
Sauvage et al.

(10) Patent No.: US 10,333,181 B2
(45) Date of Patent: Jun. 25, 2019

(54) TRANSPARENT AUTOPHOTORECHARGEABLE ELECTROCHEMICAL DEVICE

(71) Applicants: CENTRE NATIONAL DE LA RECHERCHE SCIENTIFIQUE, Paris (FR); UNIVERSITE DE PICARDIE JULES VERNE, Amiens (FR); SORBONNE UNIVERSITE, Paris (FR)

(72) Inventors: Frederic Sauvage, Digeon (FR); Christian Andriamiadamanana, Rivery (FR); Christel Laberty, Paris (FR)

(73) Assignees: CENTRE NATIONAL DE LA RECHERCHE SCIENTIFIQUE, Paris (FR); UNIVERSITE DE PICARDIE JULES VERNE, Amiens (FR); SORBONNE UNIVERSITE, Paris (FR)

( * ) Notice: Subject to any disclaimer, the term of this patent is extended or adjusted under 35 U.S.C. 154(b) by 0 days.

(21) Appl. No.: 15/100,107

(22) PCT Filed: Nov. 27, 2014

(86) PCT No.: PCT/FR2014/053056
§ 371 (c)(1),
(2) Date: May 27, 2016

(87) PCT Pub. No.: WO2015/079170
PCT Pub. Date: Jun. 4, 2015

(65) Prior Publication Data
US 2018/0175463 A1 Jun. 21, 2018

(30) Foreign Application Priority Data
Nov. 28, 2013 (FR) ..................... 13 61775

(51) Int. Cl.
| | | |
|---|---|---|
| *H01M 10/46* | (2006.01) | |
| *H01M 4/48* | (2010.01) | |
| *H01G 9/20* | (2006.01) | |
| *H01M 4/58* | (2010.01) | |
| *H01M 10/0525* | (2010.01) | |
| *H01M 14/00* | (2006.01) | |
| *H01M 4/485* | (2010.01) | |
| *H01M 4/505* | (2010.01) | |
| *H01M 4/50* | (2010.01) | |
| *H01M 4/52* | (2010.01) | |

(52) U.S. Cl.
CPC ........ *H01M 10/465* (2013.01); *H01G 9/2004* (2013.01); *H01G 9/2022* (2013.01); *H01G 9/2031* (2013.01); *H01M 4/483* (2013.01); *H01M 4/485* (2013.01); *H01M 4/505* (2013.01); *H01M 4/5825* (2013.01); *H01M 10/0525* (2013.01); *H01M 14/005* (2013.01); *H01L 2924/0002* (2013.01); *H01M 4/502* (2013.01); *H01M 4/523* (2013.01); *Y02E 10/542* (2013.01); *Y02E 60/122* (2013.01); *Y02T 10/7011* (2013.01); *Y02T 10/7022* (2013.01)

(58) Field of Classification Search
CPC .......... H01M 10/465; H01M 10/0525; H01M 4/483; H01M 4/485; H01M 4/502; H01M 4/505; H01M 4/523; H01M 4/5825; H01G 9/2004; H01G 9/2022; H01G 9/2031; H01L 2924/0002; Y02E 60/122; Y02T 10/7011; Y02T 10/7022
See application file for complete search history.

(56) References Cited

U.S. PATENT DOCUMENTS

| | | | |
|---|---|---|---|
| 4,916,035 A | 4/1990 | Yamashita et al. | |
| 2003/0062080 A1* | 4/2003 | Satoh | H01G 9/20 136/256 |
| 2008/0210296 A1 | 9/2008 | Morooka et al. | |
| 2009/0056808 A1* | 3/2009 | Jo | H01G 9/2031 136/261 |
| 2009/0061315 A1* | 3/2009 | Nakano | H01M 4/0404 429/218.1 |
| 2009/0078307 A1 | 3/2009 | Segawa et al. | |
| 2009/0146604 A1 | 6/2009 | Choi et al. | |
| 2009/0226808 A1* | 9/2009 | Hiwara | H01G 9/038 429/200 |
| 2012/0021300 A1* | 1/2012 | Abe | H01M 6/166 429/328 |
| 2012/0138147 A1 | 6/2012 | Tsuda et al. | |

FOREIGN PATENT DOCUMENTS

| | | |
|---|---|---|
| JP | H 10208782 | 8/1998 |
| JP | H 2008258011 | 10/2008 |

OTHER PUBLICATIONS

Wan, L., Li, J.F., Feng, J.Y., Sun, W., Mao, Z.Q.-Anatase TiO2 films with 2.2eV band gap prepared by micro-arc oxidation, Material Science and Engineering B 139 (2007), pp. 216-220 (Year: 2007).*
Al-Falahi, A.H.-Structural and Optical Properties of MnO2:Pb Nanocrystalline Thin Films Deposited by Chemical Spray Pyrolysis, IOSR Journel of Engineering (IOSRJEN), vol. 3, issue 4, (Apr. 2013), pp. 52-57 (Year: 2013).*
Machine translation of JP 10-208782, published on Aug. 7, 1998 (Year: 1998).*
Machine translation JP 2008-258011, published on Oct. 23, 2008 (Year: 2008).*

(Continued)

*Primary Examiner* — Anca Eoff
(74) *Attorney, Agent, or Firm* — Maier & Maier, PLLC (57) ABSTRACT

A transparent photorechargeable electrochemical device is provided. An n-type semiconductor may be used as a positive-electrode active material in the transparent photorechargeable electrochemical device. A method for photorecharging the device is also provided.

16 Claims, 5 Drawing Sheets

(56) References Cited

OTHER PUBLICATIONS

Search Report dated 2015.
Sharon M et al: "Solar rechargeable battery-principle and materials"Dated: Jan. 1, 1991.
Japanese Office action dated Oct. 23, 2018.

* cited by examiner

TRANSPARENT AUTOPHOTORECHARGEABLE ELECTROCHEMICAL DEVICE

RELATED APPLICATIONS

This application is a National Phase Application of PCT/FR2014/053056, filed on Nov. 27, 2014, which in turn claims the benefit of priority from French Patent Application No. 13 617775 filed on Nov. 28, 2013, the entirety of which are incorporated herein by reference.

BACKGROUND

Field of the Invention:

The present invention relates to a transparent photorechargeable electrochemical device, to the use of an n-type semiconductor as positive-electrode active material in said transparent photorechargeable electrochemical device, and to a method for photorecharging said device. In particular, it relates to the field of alkaline batteries, and especially to lithium batteries.

Description of Related Art:

Lithium batteries have become essential components in many devices including portable appliances such as, in particular, mobile phones, computers and handheld tools, or heavier machinery such as two-wheeled means of transportation (bicycles, mopeds) or four-wheeled means of transportation (hybrid or electric automotive vehicles). They have also been widely studied for use in the field of power storage.

A lithium battery comprises at least one negative electrode and at least one positive electrode between which is placed a solid electrolyte or a separator impregnated with a liquid electrolyte. The liquid electrolyte for example consists of a lithium salt in solution in a solvent chosen to optimize the transport and disassociation of ions. The positive electrode consists of a current collector bearing an electrode material that contains at least one positive-electrode active material capable of Inserting lithium ions reversibly; the negative electrode consists of a sheet of lithium metal (optionally carried by a current collector), of a lithium alloy or of an intermetallic lithium compound (lithium battery), or of a current collector carrying an electrode material that contains at least one negative-electrode active material capable of inserting lithium ions reversibly (lithium-ion battery)

During operation of the battery, lithium ions pass from one of the electrodes to the other through the electrolyte. During the discharge of the battery, a quantity of lithium from the electrolyte reacts with the positive-electrode active material, and an equivalent quantity is introduced into the electrolyte from the active material of the negative electrode, the lithium concentration thus remaining constant in the electrolyte. The insertion of lithium into the positive electrode is compensated for by electrons from the negative electrode, supplied via an exterior circuit. During charging, the reverse effects take place.

The per-unit-weight energy densities currently obtained in various electrochemical energy-storage systems are 200-250 Wh/kg for the best Li-on batteries, 100-150 Wh/kg for an Na-ion battery, 350 Wh/kg for a Li—S battery, 500 Wh/kg for a lithium-air battery and 50 Wh/kg for a redox-flow battery. These batteries therefore have relatively low per-unit-weight energy densities (meaning the amount of deliverable power is limited) and must be recharged via the mains grid.

Moreover, over the last decade, devices allowing solar energy to be converted into electrical power have been proposed. In particular, Grätzel has developed a dye-sensitized solar cell (DSSc, DSC or DYSC) comprising a transparent, electrically conductive layer of fluorine-doped tin oxide $SnO_2.F$, on which layer is placed a photoanode of titanium oxide $TiO_2$, on the surface of which a photosensitive pigment (e.g. a ruthenium (+II) polypyridyl complex) is grafted; a platinum counterelectrode; and an iodide/triiodide electrolyte ($I^-/I_3^-$). However, such a photovoltaic cell does not allow energy to be stored.

Other systems such as photocapacitors combining two technologies, i.e. a photovoltaic cell and a capacitor, have been developed in order to allow electricity directly converted from light energy to be stored. Generally, such systems comprise a photoelectrode; a bifunctional internal electrode, i.e. an electrode that functions both as a cathode and as an anode, and that is located between and in contact with two different electrolytes; and a counterelectrode in the capacitor portion. However, in order to maintain a good performance level, migration and/or diffusion of oxidoreductive species into the capacitor portion must be inhibited, creating difficulties in the manufacture of such systems and in the design of high-performance materials. Moreover, such systems have a high production cost. By way of example, US2009/0078307 describes a device combining two technologies: a DSSc photovoltaic cell and an anionic battery. However, the storage capacities achieved are relatively low since they are about 0.01 mAh/cm².

Tributsch [*J. Appl. Phys.*, 1987, 62, 11, 4597-4605] has therefore proposed photorechargeable batteries using semiconductors capable of reversibly photoinducing the intercalation of metal ions. In particular, Tributsch proposes a photorechargeable battery comprising a photoelectrode comprising a p-type semiconductor such as copper thiosulphate $Cu_3PS_4$, a counterelectrode such as a copper wire, and an electrolyte comprising a solution of copper chloride (CuCl) and of tetrabutylammonium perchlorate (TBAPC) in acetonitrile. However, the performance level obtained is limited, especially by the slow rate of the discharge reaction. Moreover, the use of copper does not allow high voltages to be achieved. Lastly, sulphur-based semiconductors are to be avoided since they generally induce, during the excitation by light waves, photoelectrolysis of water even if the electrolyte only contains a small amount thereof. Furthermore, such semiconductors may be corroded in the electrolyte.

Objects and Summary

Thus, none of the prior-art documents describes a system allowing both light energy to be converted into electrical power and its storage in the form of chemical energy, and having a good storage capacity, so as to make said system independent of the mains grid, especially by virtue of its rechargeability under the effect of light waves.

The aim of the present invention is to provide a transparent photorechargeable electrochemical device that is able both to store energy and to be recharged under the effect of light waves, especially while implementing just one technology. In particular, the aim of the present invention is to mitigate all or some of the aforementioned drawbacks and to provide a transparent photorechargeable electrochemical device that is rechargeable under the effect of light waves in a few minutes whatever its level of discharge, that has a significantly higher energy density and power than those of prior-art devices, and that lastly solves the problem of intermittent light cycles.

Therefore, a first subject of the present invention is a transparent photorechargeable electrochemical device, said device being characterized in that it comprises:
- a positive electrode comprising a transparent conductive carrier on which a positive-electrode film is deposited, said positive-electrode film comprising an n-type semiconductor by way of positive-electrode active material, said n-type semiconductor having a bandgap Eg and being capable of intercalating and deintercalating ions of an alkali metal M1;
- a negative electrode comprising an element chosen from said alkali metal M1, an alloy of said alkali metal M1, and an intermetallic compound of said alkali metal M1; and
- a non-aqueous liquid electrolyte comprising a salt of said alkali metal M1 and an organic solvent, said positive and negative electrodes respectively having electrode potentials E1 and E2 where E1>E2, E1 and E2 being calculated versus the electrode potential of the $M1^+/M1^0$ couple.

In the present invention, the expression "transparent device (or carrier)" is understood to mean a device (or a carrier) that lets light waves (i.e. light) pass.

The light waves may comprise electromagnetic waves the wavelength of which corresponds to the visible spectrum, i.e. the wavelengths between 380 and 780 nm, the electromagnetic waves located in the near-infrared domain, i.e. wavelengths between 780 and 3000 nm, and the electromagnetic waves located in a portion of the ultraviolet domain, i.e. wavelengths between 310 and 380 nm.

Electromagnetic waves the wavelength of which corresponds to the visible spectrum, i.e. the wavelengths between 380 and 780 nm, are particularly preferred.

The expression "conductive" carrier is understood to mean a carrier that has a conductivity ranging from about $10^{-1}$ S/cm to $10^3$ S/cm.

The transparent photorechargeable electrochemical device according to the invention functions under the effect of light waves originating from any type of source, i.e. either from a natural source (the Sun) or from an artificial source (lights). In addition, it is capable of recharging under the effect of light waves in a few minutes whatever its discharge level, of occasionally recharging in the dark when it has been exposed for a certain time to a source of light waves, and it has a very good electrochemical performance level, especially by virtue of its sufficiently rapid photorecharging process, which compensates for its discharge if the latter occurs under illumination.

Furthermore, said device allows relatively power-intensive electrical elements to be Installed in geographic zones devoid of a mains grid supply and to decrease the cost of producing and storing solar kWhs. Lastly, the device of the invention Implements just one technology and thus allows use of complex systems combining two technologies such as those described in the prior art to be avoided.

According to one particular embodiment of the invention, the device of the invention consists of the positive electrode, the negative electrode and the non-aqueous liquid electrolyte such as defined in the present invention.

In one preferred embodiment, the electrode potentials E1 and E2 are comprised between 0 and 5 volts versus the $M1^+/M1^0$ couple.

In one particular embodiment, the device according to the invention is hermetic.

In one particular embodiment, the alkali metal M1 of the device according to invention is chosen from lithium, sodium and potassium. Lithium is preferred.

In one particular embodiment, the n-type semiconductor of the transparent photorechargeable electrochemical device according to the invention is chosen from metal oxides, metal phosphates, metal sulphates, and metal oxalates, in which the metals are chosen from Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, Rg, Cn (i.e. the transition metals) and Bi.

The metals are preferably chosen from Ti, Fe, Mn, Co, Ni, Sn, Ru, Bi, V, Cr, Cu, Nb, Mo et Zn.

By way of example of metal oxides, mention may especially be made of $TiO_2$, $Fe_2O_3$, $Fe_3O_4$, $MnO_2$, CoO, $Co_3O_4$, NiO, $SnO_2$, $RuO_2$, $Bi_2O_3$, $VO_2$, $V_2O_5$, $Cr_2O_3$, CuO, $Cu_2O$, $Nb_2O_5$, $MoO_3$, ZnO.

Preferred metal oxides are chosen from $TiO_2$, $Fe_2O_3$, $Fe_3O_4$, $MnO_2$, CoO, $Co_3O_4$, $SnO_2$, $RuO_2$, $Bi_2O_3$, $VO_2$, $V_2O_5$, $Cr_2O$, $Nb_2O_5$ and ZnO.

The n-type semiconductor is preferably $TiO_2$.

By way of example of metal phosphates, mention may especially be made of:
- olivines respecting the formula $MM'PO_4$, in which M=Li or Na and M'=Fe, Co, Mn, Ni or a mixture thereof;
- fluorinated, hydroxylated and oxygenated derivatives respecting the formulae $M_xM''PO_4F$, $M_xM''PO_4.OH$ and $M_xM''PO_4.O$, in which M has the same definition as above, M''=Fe, Co, Mn, Ni, V or Ti and x ranges from 0 to 2;
- carbonophosphates respecting the formula $M_3M'PO_4CO_3$, in which M and M' have the same definitions as above; and lastly
- pyrophosphates respecting the formula $M_xM'P_2O_7$, in which M, M' and x have the same definitions as above.

By way of example of metal sulphates, mention may especially be made of materials respecting the formulae $M'_2(SO_4)_3$, $MM''SO_4F$ and $M_xM''OSO_4$, in which M, M', M'' and x have the same definitions as above.

By way of example of metal oxalates, mention may especially be made of compounds respecting the formula $M_2M'(C_2O_4)_2$, in which M and M' have the same definitions as above.

The n-type semiconductor recommended for the present invention is preferably titanium oxide ($TiO_2$) and even more preferably anatase titanium oxide (anatase $TiO_2$).

In the present invention, the electrode potentials E1 and E2 are measured versus the $M1^+/M1^0$ electrode potential and E1 is >E2. If the electron potential energies E1' and E2', of the positive and negative electrodes of the device of the present invention, respectively, were to be considered, the inverse relationship E1'<E2' would be obtained since E1' and E2' would then be measured relative to the zero of the electron energy scale, i.e. relative to the energy of the electron in vacuum.

When the value of E1 approaches the value of E2 while respecting E1>E2, the transparent photorechargeable electrochemical device according to the invention accumulates chemical energy during the absorption of light through the deintercalation of ions of the alkali metal M1, which deintercalation takes place during the oxidation of the metal (transition metal or B) present in the n-type semiconductor. This photooxidation of the n-type semiconductor results from a charge separation effect that occurs during the absorption of the light. This separation mainly takes place in the electron depletion region of the n-type semiconductor, wherein a substantial number of electron holes accumulate on the surface of said n-type semiconductor.

Thus, in the device of the invention, the positive electrode is a photoelectrode. During operation of the device, the positive electrode intercalates and deintercalates ions of the alkali metal M1 by virtue of the presence of the n-type semiconductor contained in said positive electrode. The negative electrode corresponds to a negative electrode of a conventional lithium battery. During operation of the device, it intercalates and deintercalates ions of the alkali metal M1.

In the device of the invention, the positive electrode comprises no elements other than the n-type semiconductor for intercalating and deintercalating ions of the alkali metal M1.

In one particular embodiment, the n-type semiconductor has a bandgap Eg of at most about 4.0 eV and preferably of from about 0.4 eV to 3.5 eV and even more preferably of from 1.2 eV to 3.5 eV.

The n-type semiconductors of the invention have a bandgap compatible with the maximum voltage range [4.5-5 volts] in which the electrolyte of the device is stable. Thus, the n-type semiconductors of the invention are stable in the reduced and oxidized state, and any oxidation reactions that would lead to degradation of the electrolyte are avoided.

In other words, the device of the invention does not require a protective system such as a Zener diode.

In one particular embodiment, said positive-electrode film comprising said n-type semiconductor by way of positive-electrode active material has a thickness ranging from about 0.1 to 25 μm and preferably from about 0.5 to 15 μm.

In one particular embodiment, the n-type semiconductor takes the form of nanoparticles, i.e. it may comprise particles of diameter ranging from about 2 to 50 nm, preferably of diameter ranging from about 2 to 20 nm, and even more preferably of diameter ranging from about 2 to 10 nm. When the particles of the n-type semiconductor have a diameter smaller than 2 nm, the electrolyte cannot easily penetrate into said positive-electrode film and thus effectively impregnate it. When the particles of the n-type semiconductor have a diameter larger than 50 nm, intercalation of the ions of the alkali metal M1 in the n-type semiconductor becomes difficult and thus, it may be incomplete.

In one particular embodiment, the n-type semiconductor has a specific surface area measured by the B.E.T method ranging from about 20 $m^2/g$ to 500 $m^2/g$ and preferably from about 150 $m^2/g$ to 400 $m^2/g$ and even more preferably from about 230 $m^2/g$ to 310 $m^2/g$.

By virtue of the fact that it takes the form of nanoparticles and of its high specific surface area, the n-type semiconductor has a high surface reactivity. Thus, Insertion and conduction of the ions of the alkali metal M1 in said n-type semiconductor are facilitated.

In one particular embodiment, the positive-electrode film has a porous structure comprising at least mesopores, and preferably has a mesoporous structure.

In one particular embodiment, the n-type semiconductor constitutes at least about 90% by weight, preferably at least about 95% by weight, and even more preferably at least about 98% by weight of the total weight of the positive-electrode film.

The salt of the alkali metal M1 used in the liquid electrolyte of the device according to the invention may for example be chosen from lithium salts such as $LiPF_6$, $LiAsF_6$, $LiClO_4$, $LiBF_4$, $LiC_4BO_8$, $Li(C_2F_5SO_2)_2N$, $Li[(C_2F_5)_3PF_3]$, $LiCF_3SO_3$, $LiCH_3SO_3$, $LiN(SO_2CF_3)_2$ and $LiN(SO_2F)_2$, sodium salts such as $NaClO_4$, $NaBF_4$, $NaPF$, $Na_2SO_4$, $NaNO_3$, $Na_3PO_4$, $Na_2CO_3$, sodium bis(trifluoromethanesulfonyl)imide (NaTFSI), sodium bis(perfluoroalkylsulfonyl)methane, sodium tris(perfluoro-alkylsulfonyl)methane, and potassium salts such as $KPF_6$, $KAsF_6$, $KClO_4$, $KBF_4$, $KCF_3SO$, $KCH_3SO_3$ and $KN(SO_2CF_3)_2$.

Among such salts, $M1PF_6$ (M1=Li, Na or K) are particularly preferred.

The organic solvent used in the liquid electrolyte of the device according to the invention allows the transport and disassociation of the ions of the alkali metal M1 to be optimized.

It may comprise one or more aprotic polar compounds chosen from cyclic or linear carbonates, cyclic or linear ethers, cyclic or linear esters, cyclic or linear sulphones, the sulfamides and the nitriles. The organic solvent preferably comprises at least two carbonates chosen from ethylene carbonate, propylene carbonate, dimethyl carbonate, diethyl carbonate and ethyl methyl carbonate.

The positive electrode film of the device according to the invention may furthermore comprise an agent for promoting electronic conductivity, said agent for promoting electronic conductivity being chosen for its ability to extract and conduct electrons while not absorbing light or absorbing light as little as possible, i.e. It has a lower proportional absorbance than that of the n-type semiconductor. The agent for promoting electronic conductivity recommended for the present invention is preferably chosen from carbon black, SP carbon, acetylene black, carbon nanofibres and fibres, carbon nanotubes, metal and semimetal fibres and a mixture thereof. When it is used, the agent for promoting electronic conductivity generally constitutes at most about 15% by weight, and preferably at most about 5% by weight, and even more preferably at most 3% of the total weight of the positive-electrode film.

Preferably, there is no agent for promoting electronic conductivity in the positive-electrode film of the invention.

In one particular embodiment, the positive-electrode film of the device according to the invention may furthermore comprise a binder, said binder being chosen so as to improve the cohesion between the particles of active material and/or between the particles of active material and the agent for promoting electronic conductivity if it is present. Said binder must not absorb light. The binder recommended for the present invention is preferably chosen from cellulose derivatives such as hydroxyethycellulose and fluoropolymers such as PVDF and PVDF-HFP. When a binder is used, it generally constitutes at most about 5% by weight, and preferably at most about 3% by weight of the total weight of the positive-electrode film.

Preferably, there is no binder in the positive-electrode film of the invention.

In one particular embodiment, the positive-electrode film of the device according to the invention furthermore comprises additives such as dyes and/or reflectors of light.

Preferably, the positive-electrode film comprises at least one dye and/or at least one reflector of light.

Dyes allow more light to be absorbed and thus the light to be better used. By way of example of dyes, mention may especially be made of polypyridyl complexes of ruthenium (+II), osmium (+II), iron (+II) or copper (+II); of donor-Π-acceptor type organic molecules; and of other organic molecules such as the perylene diimides, the squaraines, the phthalocyanines, the anthocyanins, the indolines, the coumarines or eosin Y.

The positive electrode film may comprise at most about 2% by weight and preferably at most about 1% by weight of dyes.

The reflectors of light are materials having a high refractive index, preferably ranging from 1.5 to 4. They allow the light to be better confined in the n-type semiconductor. By way of example of reflectors of light, mention may especially be made of macropores, photonic crystals (e.g. $SiO_2$/

$TiO_2$), plasmonic structures and any insulating or semiconductor oxides the particle size of which is comparable to the wavelengths of the incident light that it is desired to reflect.

Preferably, the semiconductor oxides are chosen from anatase $TiO_2$, rutile $TiO_2$, $SiO_2$, $ZrO_2$, $Nb_2O_5$ and the following compounds of the perovskite family: $SrTiO_3$, $CaTiO_3$ and $BaTiO_3$.

By way of example, the positive-electrode film of the device according to the invention may comprise particles of anatase $TiO_2$ of diameter ranging from 4 to 6 nm by way of n-type semiconductor, and particles of anatase $TiO_2$ of diameter ranging from 400 to 800 nm by way of a reflector of light. The anatase particles of $TiO_2$ of diameter ranging from 400 to 800 nm reflect light that has not been absorbed by the n-type semiconductor.

Preferably, the reflector of light is different from the n-type semiconductor.

The positive-electrode film may comprise at most about 15% by weight, and preferably at most about 5% by weight of reflectors of light.

In one particular embodiment, the transparent conductive carrier is a transparent conductive glass of FTO (fluorine-doped tin oxide) type, of ITO (indium-doped tin oxide) type, or of ZITO (zinc- and indium-doped tin oxide) type.

In another embodiment, the transparent conductive carrier is a flexible conductive carrier made of PET (polyethylene terephthalate) or PEN (polyethylene naphthalate).

In one particular embodiment, said transparent conductive carrier has a thickness ranging from about 100 to 4000 μm and preferably from about 500 to 3000 μm.

In one particular embodiment, the device according to the invention is connected to an apparatus for measuring potential and current, in order to evaluate and follow the state of charge of said device.

Techniques allowing a positive-electrode film with a mesoporous structure to be obtained are well known in the art. By way of example, the n-type semiconductor is mixed with an organic solvent (e.g. terpineol) and an organic compound (e.g. a cellulose derivative) to form a paste. Next, the paste is calcinated in order to decompose the organic compound while evaporating the solvent. At the end of the calcination, the organic compound is no longer present within the positive-electrode film of the invention.

The cellulose derivatives may be hydroxyethylcellulose, methylcellulose, hydroxypropylmethylcellulose or carboxymethylcellulose.

Techniques allowing the positive-electrode film comprising the n-type semiconductor to be deposited on said transparent conductive carrier in the device according to the invention are well known in the art. They may comprise screen printing, pulsed-laser ablation or the sol-gel technique associated with dip coating.

A second subject of the present invention is the use of an n-type semiconductor as positive-electrode active material in the transparent photorechargeable electrochemical device according to the invention and such as defined above.

Said n-type semiconductor used as positive-electrode active material in the transparent photorechargeable electrochemical device according to the invention may be said n-type semiconductor such as described above.

A third subject of the present invention is a method for photorecharging the transparent photorechargeable electrochemical device according to the present invention, said method being characterized in that it comprises the following step:

i) exposing said device, preferably on the side of said device comprising said positive electrode, to a source of light waves for at least 30 minutes, and preferably for at least 1 hour, in order to obtain said recharged device.

In said method, the device before step i) is either completely discharged or at least partially discharged, the discharge resulting from use of said device as a "battery" to power an electrical appliance, such as a mobile phone, a computer, etc.

When the device before step i) is completely discharged, it cannot be used before step i) as a "battery" to power an electrical appliance during step i).

In contrast, during step i), the device may be used as a "battery" to power an electrical appliance concomitantly with step i), provided that the device consumes less power than that produced during step i), i.e. during the absorption of light waves.

In one particular embodiment, step i) may be carried out as many times as necessary, especially when the user of said device always has at his disposal a source of light waves for recharging said device.

In this method, no supply of electricity is necessary to recharge said device.

The photorecharging method of the invention does not require the presence of a voltage booster within said device to perform the photorecharging in step i), as may be the case in the complex systems of the prior art combining two technologies.

In one particular embodiment, the source of light waves is a white light.

In one even more particular embodiment, the source of light waves has an intensity ranging from 1 to 3000 $mW/cm^2$, and preferably from 10 to 300 $mW/cm^2$.

The photorecharging method of the invention however works independently of the light intensity. In other words, even a low intensity (i.e. about 10 $mW/cm^2$) will allow the device to be photorecharged even if this will then take a little longer than if a higher intensity were used.

Lastly, the photorecharging method of the invention does not induce self-discharge.

Another subject of the present invention is a method for recharging in the dark the transparent photorechargeable electrochemical device according to the present invention, said method being characterized in that it comprises the following steps:

i') exposing said device, preferably on the side of said device comprising said positive electrode, to a source of light waves for at least 10 hours and preferably for at least 12 hours;

ii') using the device of step i') to power an electrical apparatus; and iii') letting the device of step ii') relax in the dark for at least 6 hours, and preferably for at least 12 hours, in order to obtain said recharged device.

Before step i'), the device is preferably completely charged.

After step ii'), the device is preferably completely discharged.

In one particular embodiment, the steps ii') and iii') may be successively reiterated one or more times and preferably once.

This method may be applicable when the user of said device initially has a source of light waves at his disposal and then no longer has access, for a few days, to a source of light waves.

DETAILED DESCRIPTION:

Example Of Preparation Of A Transparent Photorechargeable Electrochemical Device 1.1 Preparation of Anatase TiO$_2$ for Use as the "n-type Semiconductor"

30 ml of titanium isopropoxide (Ti(OiPr)$_4$) were added to 300 ml of water then the resulting solution was vigourously stirred for about 4 hours until complete hydrolysis. The white precipitate obtained was then vacuum or centrifugally filtered, washed several times with water then ethanol, and dried at room temperature.

Said dried precipitate was then placed in the presence of an aqueous solution at 0.1 mol/liter of NH$_4$F for 7 days at 60° C.

TiO$_2$ nanoparticles of diameter ranging from about 4 to 6 nm and of specific surface area of about 235-300 m$^2$/g (B.E.T. method) were obtained.

1.2 Preparation of the Positive Electrode Comprising a Transparent Conductive Carrier on which a Positive-electrode Film Comprising Anatase TiO$_2$ Such as Obtained Above was Deposited The positive electrode was obtained by depositing by screen printing on a transparent conductive FTO carrier a printable paste comprising 12 g of anatase TiO$_2$ such as prepared above in step 1.1, 7.2 g of hydroxyethylcellulose and 65 g of terpineol. The paste generally comprises 22% by weight hydroxyethylcellulose of viscosity ranging from 30 to 50 mPas, and 38% by weight hydroxyethycellulose of viscosity ranging from 5 to 15 mPas for 65 g of terpineol and whatever the initial quantity of TiO$_2$ in said paste.

After the printable paste had dried on the carrier and been calcinated, a positive electrode comprising a transparent conductive carrier on which a positive-electrode film comprising only TiO$_2$ was deposited was obtained.

The screen printing was carried out with a screen-printing apparatus sold under the trade name Precima by TIFLEX.

The surface area of said positive electrode was determined from the size of the screen-printing screen.

The thickness of said positive electrode (film) was measured using an apparatus sold under the trade name DEKTAK III by Veeco.

The porosity of said positive electrode was calculated from the ratio of the actual weight of the electrode to the theoretical weight determined from its dimensions.

The positive-electrode film obtained had a surface area of 0.16 cm$^2$, a thickness of 12 µm and a porosity of about 50%.

1.3 Assembly of the Photorechargeable Electrochemical Device

The device according to the invention was obtained by placing in a glove box filled with argon a photo-electrochemical cell made of transparent soda glass comprising:
- the electrode such as prepared above in step 1.2 by way of positive electrode;
- a lithium sheet by way of negative electrode and reference electrode; and
- a solution at 1 mol/L of LiPF$_6$ lithium salt in an organic ethylene carbonate/dimethyl carbonate (1/1 by weight) solvent by way of liquid electrolyte.

Figure 1:
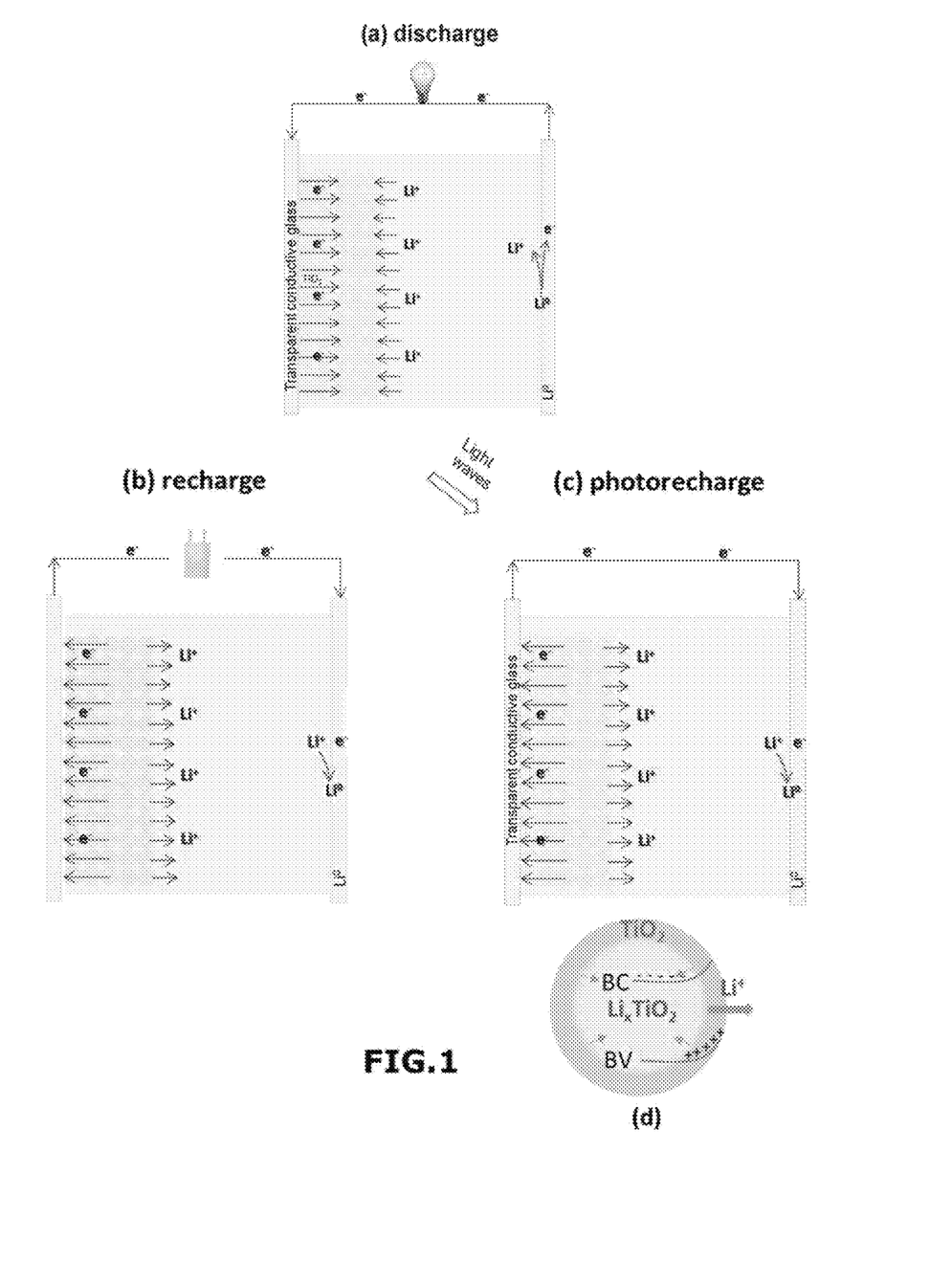
FIGS. 1a-1c depict the operating principle of the device according to one embodiment.

The appended FIG. 1 shows the operating principle of the device according to the invention. During discharge (FIG. 1a), the operating principle of the device is analogous to that of a conventional battery, i.e. the insertion of electrons and lithium ions at the positive electrode allows the latter to be reduced, this reduction being accompanied by oxidation of the lithium metal into lithium ions at the negative electrode. In a conventional device, this reaction may be reversed, i.e. during recharge the positive electrode is oxidized freeing electrodes and lithium ions, this oxidation being accompanied by reduction at the negative electrode of lithium ions into lithium metal (FIG. 1b). This reaction allows the battery to be recharged by way of an external supply of electricity (e.g. the mains grid).

This recharge may however be obtained without connection of the battery to the external grid by virtue of illumination of the photo-active electrode, which will induce a separation of electrons/hole pairs in the depletion region of the n-type semiconductor (FIGS. 1c and 1d). BV and BC represent the valence and conduction bands, respectively. Minority charge carriers will then migrate to the surface of the n-type semiconductor particles (i.e. TiO$_2$) leading to the oxidation of Ti$^{3+}$ into Ti$^{4+}$, and by charge compensation to the extraction of the lithium contained in said particles. The electrons are transported and collected in order to feed the reduction reaction at the negative electrode and thus to maintain the photo-electrochemical reaction.

Figure 2:
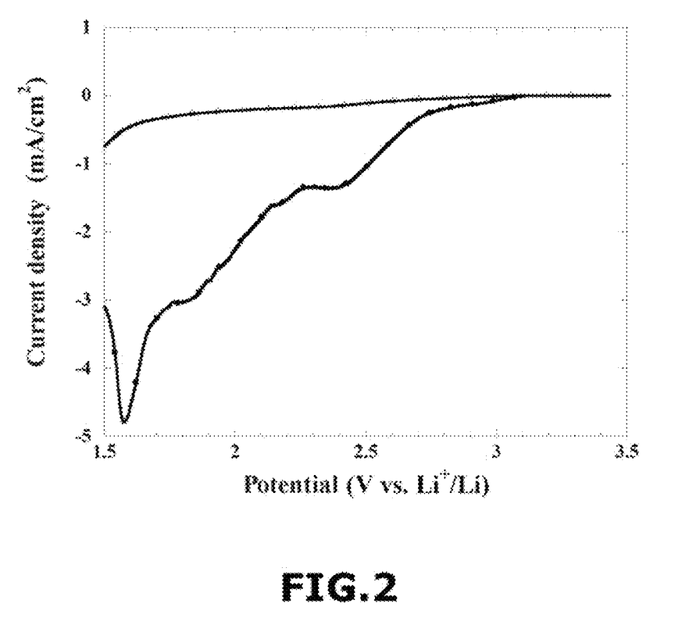
FIG. 2 is a graph showing the current density of the electrochemical device of the invention such as obtained above (in mA/cm$^2$) as a function of potential versus the Li$^+$/Li couple (in volts, V), according to one embodiment.

1.4 Study of the Closed-circuit Behaviour of the Device According to the Invention in the Dark and in the Presence of a Source of Light Waves The appended FIG. 2 shows the current density of the electrochemical device of the invention such as obtained above (in mA/cm$^2$) as a function of potential versus the Li$^+$/Li couple (in volts, V). The curve with the empty circles illustrates the behaviour of the electrochemical device of the invention during discharge in the absence of illumination (In the dark), whereas the curve with the solid circles illustrates the behaviour of the electrochemical device of the invention during discharge when the positive electrode (TiO$_2$) is exposed to a source of light waves of intensity of about 3000 mW/cm$^2$. The two curves were recorded by scanning at a rate of 0.5 mV/s until a voltage of 1.5 V (vs. Li$^+$/Li) was obtained. The application of a voltage or a current in the various experiments (i.e. closed circuit) allows the device to be discharged electrochemically. However, it will be recalled that the discharge of the device occurs naturally when the latter is used as a "battery" to supply an electrical appliance, i.e. without application of a voltage or current (i.e. open circuit).

In the absence of light waves, the discharge curve obtained (empty circles) is rigorously analogous to that obtained for a conventional non-transparent lithium battery with a positive TiO$_2$-comprising electrode (without a transparent conductive carrier) and a negative lithium-metal-comprising electrode. It shows that the insertion of lithium into the n-type anatase TiO$_2$ semiconductor induces, on the one hand, partial reduction of the transition metal Ti$^{4+}$ Into Ti$^{3+}$ and, on the other hand, a change in the colour of the electrode from white (characteristic of TiO$_2$) to an intense blue. This colour change results from the formation of a new intermediate band in the band structure of the material, which band is associated with the electron-rich character of the Ti$^{3+}$ orbital 3d-O 2p. The insertion and deinsertion of lithium under these conditions occurs at a redox potential of about 1.8 V (vs. Li$^+$/Li) at equilibrium. Integration of said curve with respect to time allows an empirical value for capacity per unit weight of about 69 mAh/g to be obtained. However, this value is lower than the theoretical value of 168 mAh/g, which corresponds to an insertion of about 0.5 Li$^+$ per formula unit. This difference in value is due, on the one hand, to the absence, from the positive electrode such as prepared, of an agent such as carbon for promoting electronic conduction and, on the other hand, to the lithium insertion regime used in this example, which is relatively high.

However, when the positive electrode (TiO$_2$) is subjected to a source of light waves of intensity of about 3000 mW/cm$^2$, the insertion of lithium into the anatase TiO$_2$ n-type semiconductor in the excited state proceeds entirely differently. The discharge curve obtained (solid circles) shows the start of the insertion of the lithium at around 3 V, a first wave of reduction at around 2.4 V, then a succession of cathodic effects up to 1.7 V and lastly a well-defined peak at 1.58 V. The current density reaches values of about 4.8 mA/cm$^2$ (at 1.58 V), whereas in the dark (curve with the empty circles) the maximum current density is 0.73 mA/cm$^2$ (at 1.5 V). The value of the capacity per unit weight in the presence of a light source is then 619 mAh/g, this value is clearly higher than the theoretical and empirical values obtained in the dark. Such a discharge capacity would correspond to about two inserted lithiums per formula unit.

During the discharging process, the positive electrode of the device according to the invention undergoes a reverse photorecharging reaction allowing the latter to be continuously regenerated. In other words, the applied potential induces insertion of lithium and the absorption of the light leads to the reverse reaction of electrochemical extraction of the lithium allowing the initial state of the electrode to be partially or entirely photoregenerated depending on the discharge conditions.

Figure 3:
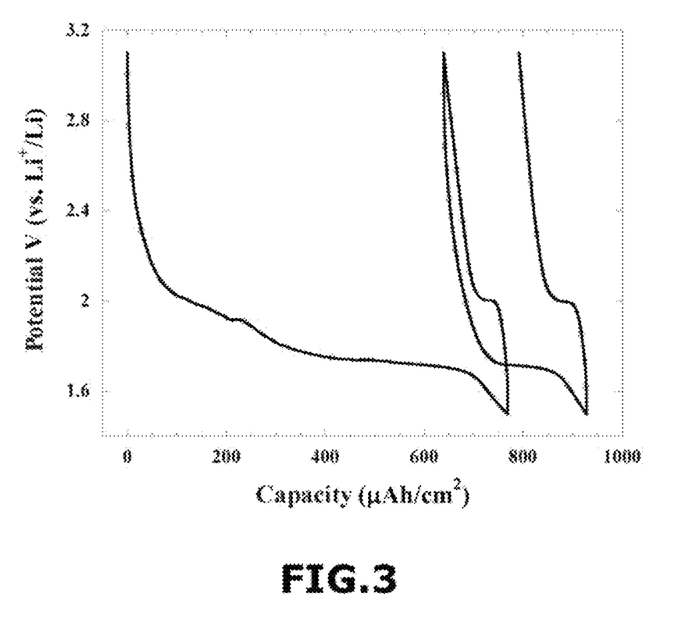
FIG. 3 is a graph showing the potential versus the Li$^+$/Li couple (in volts, V) as a function of the capacity per unit area of the electrochemical device of the invention (in µAh/cm$^2$) in the dark, according to one embodiment.

The appended FIG. 3 shows the potential versus the Li$^+$/Li couple (in volts, V) as a function of the capacity per unit area of the electrochemical device of the invention (in μAh/cm$^2$) in the dark.

Figure 4:
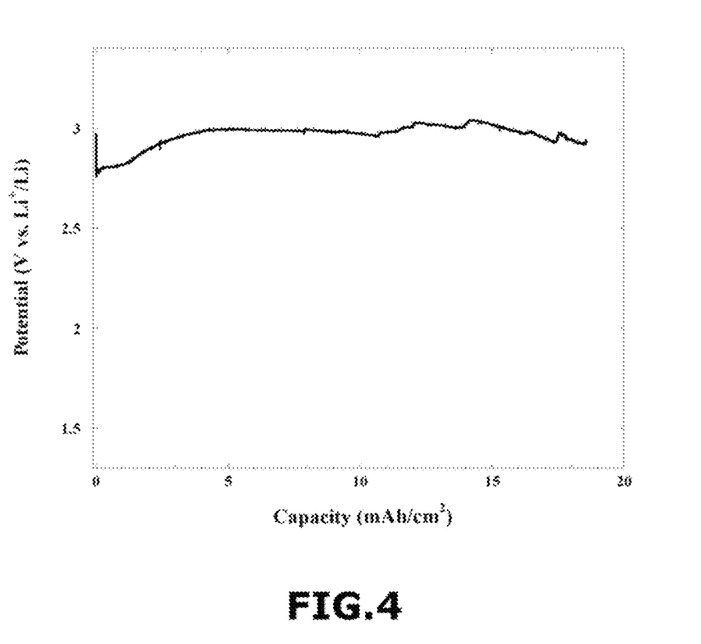
FIG. 4 is a graph showing the potential versus the Li$^+$/Li couple (in volts, V) as a function of the capacity per unit area of the electrochemical device of the invention (in mAh/cm$^2$) when the positive electrode (TiO$_2$) is exposed to a source of light waves of intensity of about 3000 mW/cm$^2$, according to one embodiment.

The appended FIG. 4 shows the potential versus the Li$^+$/Li couple (in volts, V) as a function of the capacity per unit area of the electrochemical device of the invention (in mAh/cm$^2$) when the positive electrode (TiO$_2$) is exposed to a source of light waves of intensity of about 3000 mW/cm$^2$.

FIGS. 3 and 4 were recorded by applying a current density of −100 μA/cm$^2$ between 1.5 V et 3 V (vs. Li$^+$/Li).

The Insertion of lithium in the dark (FIG. 3) leads to a discharge/charge curve analogous to that obtained for a conventional lithium battery with a positive TiO$_2$-comprising electrode and a negative lithium-metal-comprising electrode, except that in this example the irreversible capacity is higher, this being due to the absence of carbon (agent for promoting electronic conductivity) from the positive electrode such as prepared above. During the first discharge, the capacity per unit area is about 0.75 mAh/cm$^2$ at 1.5 V and it is accompanied by a rapid change in the colour of the electrode from white to blue.

When the lithium is inserted in the presence of a source of light waves (FIG. 4), under the same experimental conditions as those indicated above, an excellent capacity per unit area of 18.6 mAh/cm$^2$ is achieved, this corresponding to a capacity per unit weight of 10.4 Ah/g. Furthermore, the insertion potential obtained is much higher than in the dark since it is comprised between 2.8 and 3.05 V, this corresponding to an energy density of more than 30 kWh/kg. This high value is substantially higher than all the values obtained with currently available electrochemical storage technologies.

Moreover, during the discharge, the electrode remained white or was only slightly blue-tinged at the end of the experiment.

This behaviour may be explained by the competition between the insertion of lithium into the structure due to the applied electrode current density of 100 μA/cm$^2$ and the reverse photocurrent generated by the charge separation taking place in the depletion region and which leads to concomitant photorecharging of the electrode via an oxidation reaction.

Figure 5:
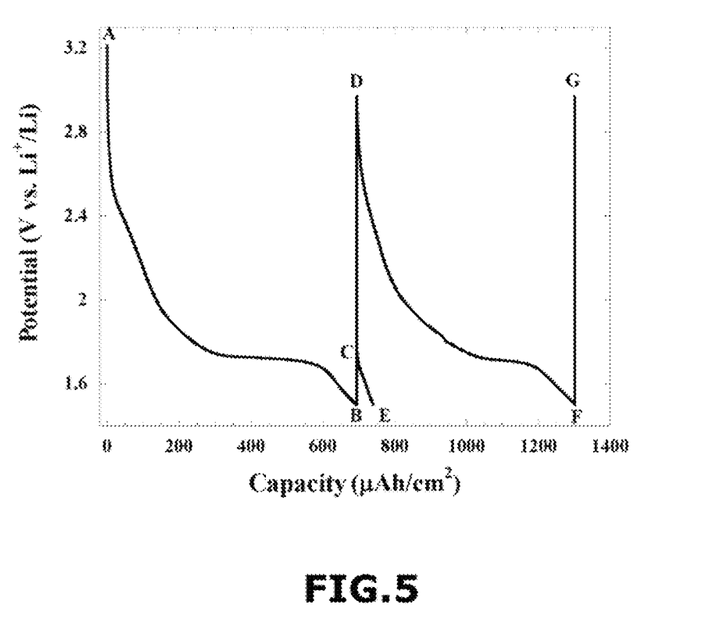
FIG. 5 is a graph showing (curve characterized by the points A, B, D, F and G) the potential versus the Li$^+$/Li couple (in volts, V) as a function of the capacity per unit area of the electrochemical device of the invention (in µAh/cm$^2$), according to one embodiment.

1.5 Photorecharge of the Device According to the Invention in the Presence of a Source of Light Waves The appended FIG. 5 (curve characterized by the points A, B, D, F and G) shows the potential versus the Li$^+$/Li couple (in volts, V) as a function of the capacity per unit area of the electrochemical device of the invention (in μAh/cm$^2$) when said device was subjected to the following steps:
  a first discharge in the dark achieved by applying a current density of 100 μA/cm$^2$, from cell open-circuit potential to 1.5 V (vs. Li$^+$/Li) (closed circuit) (FIG. 5, curve A-B);
  exposure to a source of light waves of intensity of about 3 W/cm$^2$ for one hour (open circuit) (FIG. 5, curve B-D);
  a second discharge in the dark achieved by applying a current density of 100 μA/cm$^2$, from cell open-circuit potential to 1.5 V (vs. Li$^+$/Li) (closed circuit) (FIG. 5, curve D-F); and exposure to a source of light waves of intensity of about 3000 mW/cm² for one hour (open circuit) (FIG. 5, curve F-G).

The appended FIG. 5 (curve characterized by the points A, B, C and E) shows the potential versus the Li⁺/Li couple (in volts, V) as a function of the capacity per unit area of the electrochemical device of the invention (in μAh/cm²) when said device was subjected to the following steps:
  a first discharge in the dark achieved by applying a current density of 100 μA/cm², from cell open-circuit potential to 1.5 V (vs. Li⁺/Li) (closed circuit) (FIG. 5, curve A-B);
  relaxation in the dark for one hour (open circuit) (FIG. 5, curve B-C); and
  a second discharge in the dark achieved by applying a current density of 100 μA/cm², from cell open-circuit potential to 1.5 V (vs. Li⁺/Li) (closed circuit) (FIG. 5, curve C-E).

FIG. 5 shows that the potential for the two following curves: the first curve characterized by the points A, B, D, F and G and the second curve characterized by the points A, B, C and E, is very different. Specifically, in the dark the equilibrium potential reached is 1.86 V (vs. Li⁺/Li) whereas in the presence of light waves the latter is 2.97 V (vs. Li⁺/Li). Moreover, the device which was subjected to a period of relaxation in the dark delivered a low capacity, which corresponds to the capacity remaining during the second discharge, whereas the device that was subjected to a period of exposure to a source of light waves delivers a capacity per unit area of 607 μAh/cm² which is almost equivalent to the capacity per unit area of 695 μAh/cm² obtained in the first cycle.

FIG. 5 therefore shows that, on the one hand, the absorption of the light leads to a photorecharging effect and, on the other hand, that this effect is reversible "from an electrochemical point of view" (i.e. the capacity delivered in the second cycle is almost equivalent to that obtained in the first cycle).

Furthermore, a change in the colour of the positive electrode from intense blue to white (colour characteristic of TiO₂) was observed during the period of relaxation of one hour. This change in the colour of the positive electrode is evidence of the photorecharging reaction in the device.

Figure 6:
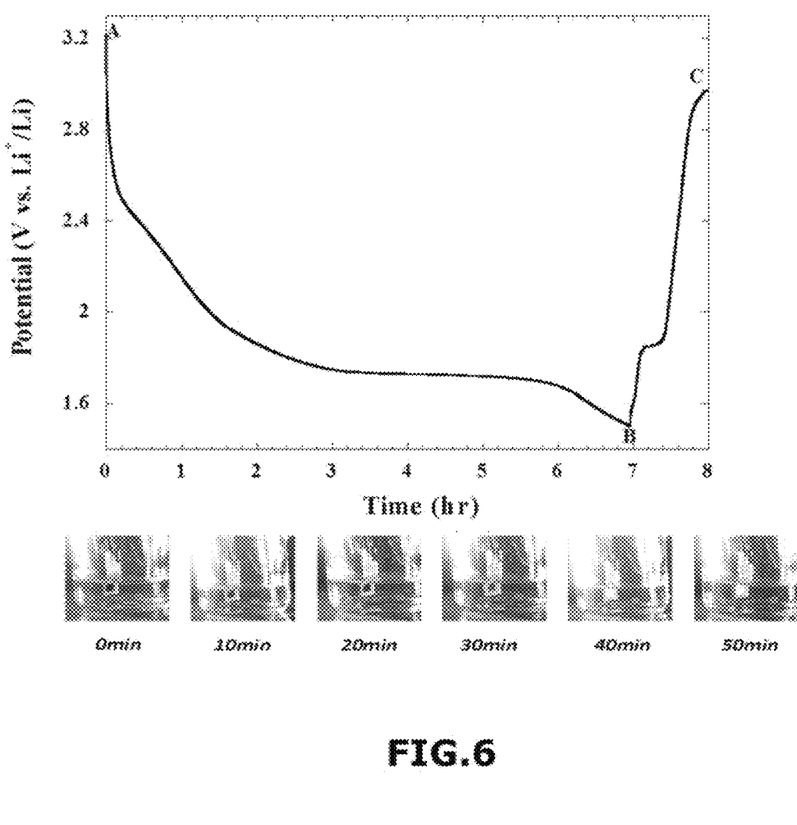
FIG. 6 is a graph showing he potential versus the Li$^+$/Li couple (in volts, V) as a function of time (in hours), according to one embodiment.

FIG. 6 shows the potential versus the Li⁺/Li couple (in volts, V) as a function of time (in hours) when the device was subjected to the following steps:
  a first discharge in the dark achieved by applying a current density of 100 μA/cm², from cell open-circuit potential to 1.5 V (vs. Li⁺/Li) (closed circuit) (FIG. 6, curve A-B); and
  exposure to a source of light waves of intensity of about 3000 mW/cm² for one hour (open circuit) (FIG. 6, curve B-C).

FIG. 6 also shows the variation of the colour of the positive electrode during the illumination as a function of time (photographs at 0 min, 10 min, 20 min, 30 min, 40 min and 50 min).

From FIG. 6, it may be observed that the photorecharging completes in less than one hour.

1.6 Recharge of the Device According to the Invention in the Dark

An already charged device according to the invention was subjected to the following steps:
  exposure to a source of light waves of intensity of about 3000 mW/cm² for twelve hours (open circuit);
  discharge in the dark achieved by applying a current density of 100 μA/cm², from cell open-circuit potential to 1.5 V (vs. Li⁺/Li) (closed circuit); and
  a period of relaxation in the dark lasting 1 hour, 6 hours or 12 hours (open circuit).

Figure 7:
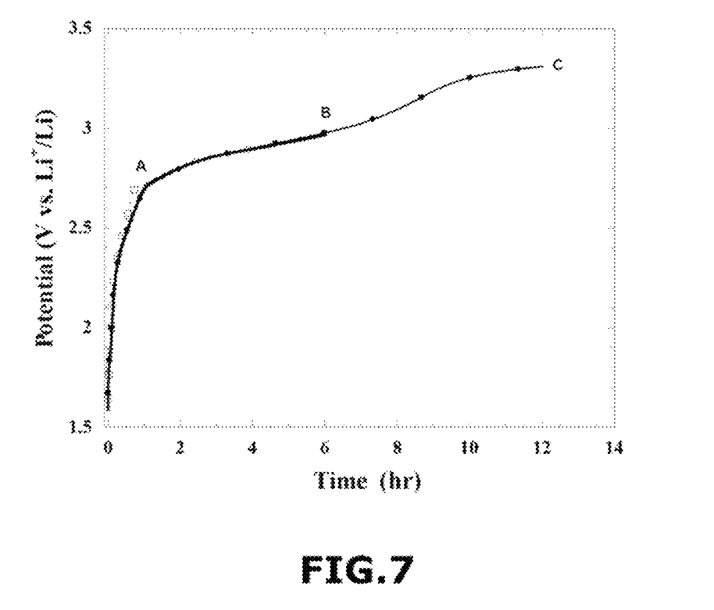
FIG. 7 is a graph showing the potential versus the Li$^+$/Li couple (in volts, V) as a function of time (in hours) during the period of relaxation in the dark, when the latter is of 1 hour (curve with the empty squares), of 6 hours (curve with the empty circles), and of 12 hours (curve with the solid circles), according to one embodiment.

FIG. 7 shows the potential versus the Li⁺/Li couple (In volts, V) as a function of time (in hours) during the period of relaxation in the dark, when the latter is of 1 hour (curve with the empty squares), of 6 hours (curve with the empty circles), and of 12 hours (curve with the solid circles).

Figure 8:
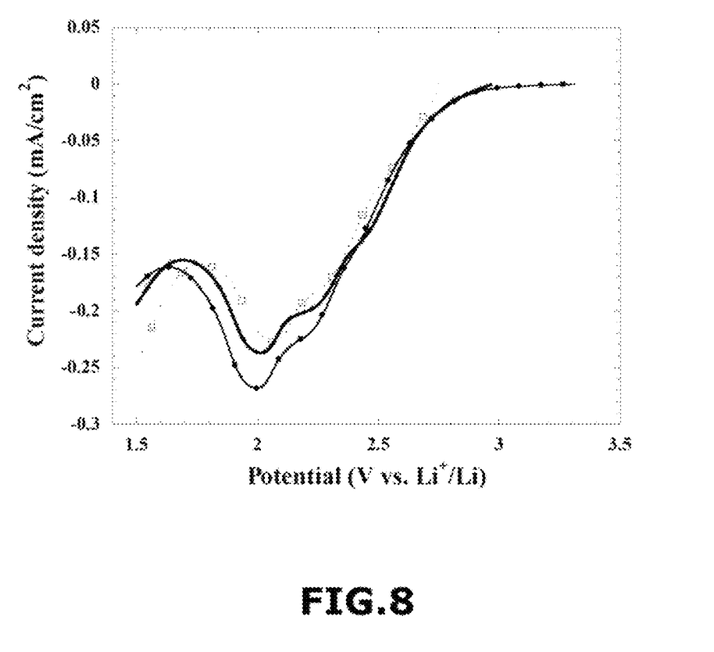
FIG. 8 is a graph showing the current density (in mA/cm$^2$) as a function of the potential versus the Li$^+$/Li couple (in volts, V) during the period of relaxation in the dark, when the latter is of 1 hour (curve with the empty squares), of 6 hours (curve with the empty circles), and of 12 hours (curve with the solid circles), according to one embodiment.

FIG. 8 shows the current density (in mA/cm²) as a function of the potential versus the Li⁺/Li couple (in volts, V) during the period of relaxation in the dark, when the latter is of 1 hour (curve with the empty squares), of 6 hours (curve with the empty circles), and of 12 hours (curve with the solid circles).

FIG. 8 shows that the current densities correspond to current densities recorded in the dark and are therefore lower by a factor of 10 than those previously recorded in the presence of a source of light waves. The electrochemical profile is different from that obtained in the dark and closer to that obtained in the presence of a source of light waves. Integration of the three curves allows the discharge capacity per unit weight to be calculated, which is comprised between 46 and 51 mAh/g, comparable to that obtained in the dark (see FIG. 2). The variation in the open-circuit potential is comparable to that observed during the exposure to a source of light waves (see FIG. 6), except that in the present case the time taken to reach the value of 3 V Is much longer (12 hours). Specifically, it was shown above that a complete photorecharge takes only one hour.

The results therefore show that one to two recharges are still possible in the dark even though the recharge takes a little more time. This is a unique property that is demonstrated here. It should allow the problem inherent to the intermittency of solar energy to be at least partially solved since the proposed device is able to be at least partially recharged in the dark. The problem of intermittency is also partially solved by virtue of the bifunctionality of the photo-active positive electrode, which is able to deliver during the day a DC current in the presence of a natural source of light waves, and to discharge all night while delivering a current density of 100 μA/cm². At the end of the night, the positive electrode, which is still operational, photoregenerates and is able to withstand many day/night cycles while constantly delivering power.

The invention claimed is:

1. A method for photorecharging a transparent photorechargeable electrochemical device which is sealed under inert atmosphere the transparent photorechargeable electrochemical device comprising:
  a positive electrode having a transparent conductive carrier on which a positive-electrode film is deposited,
  said positive-electrode film comprising titanium dioxide by way of positive-electrode active material,
  said titanium dioxide being capable of intercalating and deintercalating ions of an alkali metal M1;
  a negative electrode comprising an element chosen from said alkali metal M1, an alloy of said alkali metal M1, and an intermetallic compound of said alkali metal M1; and
  a non-aqueous liquid electrolyte comprising a salt of said alkali metal M1 and an organic solvent,
  said positive and negative electrodes respectively having electrode potentials E1 and E2 where E1>E2, E1 and E2 being calculated versus the electrode potential of the $M1^+/M1^0$ couple, the titanium dioxide and the negative electrode being directly in contact with the electrolyte, said method comprising:

exposing said device, to a source of light waves for at least 30 minutes in order to obtain said recharged device.

2. The method according to claim 1, wherein the device is exposed on the side of the positive electrode to a source of light waves.

3. The method according to claim 1, wherein the alkali metal M1 is choosen from lithium, sodium and potassium.

4. The method according to claim 1, wherein the titanium dioxide has a specific surface area measured by the B.E.T method ranging from 20 $m^2/g$ to 500 $m^2/g$.

5. The method according to claim 1, wherein the positive electrode film has a porous structure comprising at least mesopores.

6. The method according to claim 1, wherein the positive electrode film furthermore comprises at least one dye and/or at least one reflector of light.

7. The method according to claim 1, wherein the transparent conductive carrier is a transparent conductive glass of FTO, of ITO or of ZITO.

8. The method according to claim 1, wherein the positive electrode film has a thickness ranging from 0.1 to 25 µm.

9. A method for photorecharging a transparent photorechargeable electrochemical device which is sealed under inert atomosphere comprising:

a positive electrode having a transparent conductive carrier on which a positive-electrode film is deposited, said positive-electrode film comprising titanium dioxide by way of positive-electrode active material, said titanium dioxide being capable of intercalating and deintercalating ions of an alkali metal M1;

a negative electrode comprising an element chosen from said alkali metal M1, an alloy of said alkali metal M1, and an intermetallic compound of said alkali metal M1; and a non-aqueous liquid electrolyte comprising a salt of said alkali metal M1 and an organic solvent, said positive and negative electrodes respectively having electrode potentials E1 and E2 where E1>E2, E1 and E2 being calculated versus the electrode potential of the $M1^+/M1^0$ couple, the titanium dioxide and the negative electrode being directly in contact with the electrolyte, said method comprising the step of:

i') exposing said device, to a source of light waves for at least 10 hours;

ii') using the device of step i') to power an electrical apparatus; and iii') letting the device of step ii') relax in open circuit in the dark for at least 6 hours, in order to obtain said recharged device.

10. The method according to claim 9, wherein the device is exposed on the side of the positive electrode to a source of light waves.

11. The method according to claim 9, wherein the alkali metal M1 is chosen from lithium, sodium and potassium.

12. The method according to claim 9, wherein the titanium dioxide has a specific surface area measured by the B.E.T method ranging from 20 $m^2/g$ to 500 $m^2/g$.

13. The method according to claim 9, wherein the positive electrode film has a porous structure comprising at least mesopores.

14. The method according to claim 9, wherein the positive electrode film furthermore comprises at least one dye and/or at least one reflector of light.

15. The method according to claim 9, wherein the transparent conductive carrier is a transparent conductive glass of FTO, of ITO or of ZITO.

16. The method according to claim 9, wherein the positive electrode film has a thickness ranging from 0.1 to 25 µm.

* * * * *